United States Patent [19]

Bormans et al.

[11] Patent Number: 4,962,308

[45] Date of Patent: Oct. 9, 1990

[54] CHARGED PARTICLE APPARATUS COMPRISING A BEAM DISCRIMINATOR

[75] Inventors: Bernardus J. M. Bormans; Johan G. Bakker, both of Eindhoven, Netherlands

[73] Assignee: U.S. Philips Corporation, New York, N.Y.

[21] Appl. No.: 229,591

[22] Filed: Aug. 8, 1988

[30] Foreign Application Priority Data

Aug. 10, 1987 [NL] Netherlands .................... 8701871

[51] Int. Cl.⁵ .......................................... H01J 37/147
[52] U.S. Cl. ...................... 250/396 R; 250/396 ML; 250/398
[58] Field of Search ........... 250/398, 396 ML, 396 R, 250/492.3, 398, 374; 372/101

[56] References Cited

U.S. PATENT DOCUMENTS

| | | | |
|---|---|---|---|
| 4,335,309 | 6/1982 | Anger et al. | 250/398 |
| 4,687,940 | 8/1987 | Ward et al. | 250/398 |
| 4,755,685 | 7/1988 | Kawanami et al. | 250/396 ML |
| 4,835,399 | 5/1989 | Hosaka et al. | 250/396 R |

FOREIGN PATENT DOCUMENTS 0225717  6/1987  European Pat. Off. .

*Primary Examiner*—Bruce C. Anderson
*Attorney, Agent, or Firm*—Paul R. Miller

[57] ABSTRACT

For the selection of a pure electron beam or ion beam from a mixed beam, use is made of a combined electrostatic/magnetic deflection system, the electrostatic deflection system being formed, for example, by a tilted electrode system of a cascade system of electrodes present in the apparatus. The pure beam is directed onto an object to be irradiated as near to the object as possible in order to prevent renewed mixing.

11 Claims, 1 Drawing Sheet

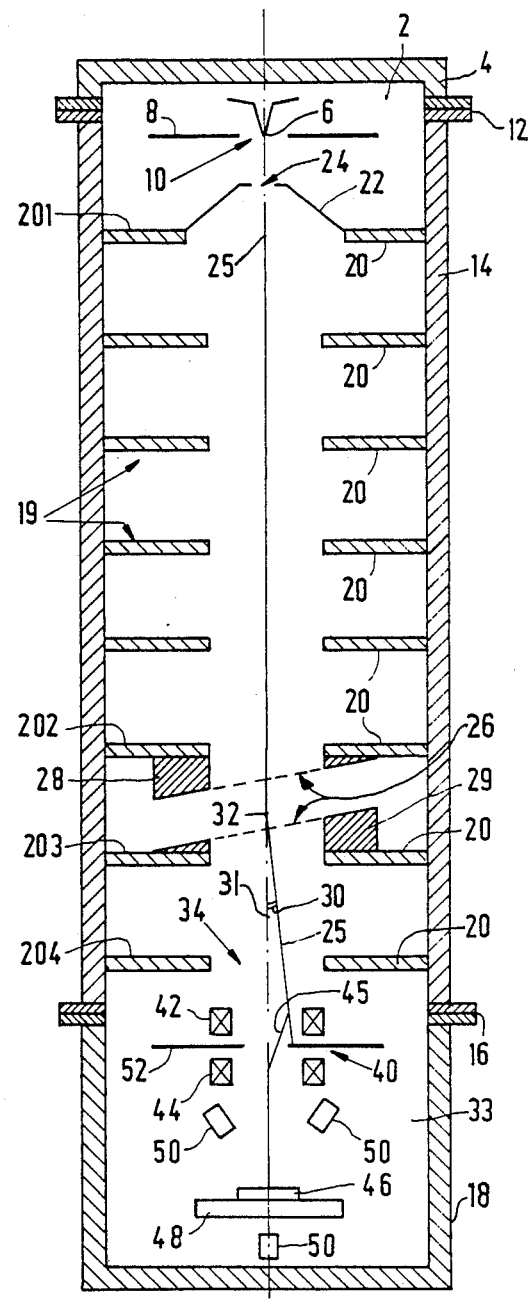

CHARGED PARTICLE APPARATUS COMPRISING A BEAM DISCRIMINATOR

The invention relates to a charged particle beam apparatus, comprising a particle source for generating a particle beam, a multiple electrode system for collimation and/or acceleration of the particle beam, and a device for a spatial separation of electrons and ions.

An apparatus of this kind is known from European Pat. No. EP 209389, corresponding to U.S. Pat. No. 4,737,726. In an apparatus described therein, ions formed by the electron beam are removed from the beam path of the electron beam by means of a cascade system of electrodes. For separation use is made of the difference in kinetic energy between electrons desired for further use and non-desired ions.

An electrode system of this kind, however, will also have an effect on the electron beam. In order to avoid the adverse effects of such influences, use is made of a cascade system of, for example, eight alternately positively and negatively charged pairs of deflection plates. Because the adverse effects on the electron beam can thus be reduced, they cannot be fully eliminated in this manner. Moreover, the separating system has a comparatively complex construction and requires very high precision with respect to positioning and control.

It is an object of the invention to mitigate the described drawbacks; to achieve this, an apparatus of the kind set forth in accordance with the invention is characterized in that the particle separating device comprises a magnetic deflection device which cooperates with an electrostatic deflection device.

A beam deflection system included in a multiple electrode system of an apparatus in accordance with the invention deflects the entire beam of charged particles away from an optical axis, the beam being deflected back by a magnetic beam alignment system so that it is again made to extend along the optical axis, preferably at a comparatively short distance before an object to be irradiated.

For the invention it is irrelevant whether the magnetic field and the electrostatic field act in the same space or at different locations and in which sequence they are arranged. A set up, comprising first an electrostatic deflection field and, situated comparatively near the object, a magnetic redeflection field, offers the advantage that the beam to be effectively used extends again along the optical axis only over a slight distance, or a main ray of the redeflected beam is directed transversely of an object to be irradiated.

In a preferred embodiment, the electrostatic deflection system is formed by an adapted electrode construction in a multiple acceleration system of the apparatus. The electrostatic deflection system notably comprises a tiltably arranged electrode system. This is achieved notably by imparting a tilted shape to one of the electrode systems. To the invention it is relevant whether the charged particle beam to be effectively used is an electron beam or an ion beam. Preferably, the entire beam is deflected away from the optical axis and the beam of particles to be used is made to extend along the optical axis again. The latter, however, is not a condition for the invention, because use can also be made of a beam which is incident at an angle, or of an object which is arranged so as to be inclined, for example, transversely with respect to the incident beam.

Some described embodiments in accordance with the invention will be described in detail hereinafter with reference to the drawing.

The sole FIGURE of the drawing diagrammatically shows an apparatus in accordance with the invention, comprising a particle source 2 which is accommodated in a source housing 4 and which comprises an emitter 6, for example a filament wire, an emission needle, a lanthanum hexaboride emitter, a semiconductor emitter or the like as an electron source (for example, see European Pat. No. EP 192244), or it comprises an ion source, for example, as described in European Pat. No. EP 80170, EP No. 37455 or U.S. Pat. No. 3,731,089. Of the source only a first anode 8 with an aperture 10 is shown. Using the anode, and possibly a grid, the beam current can be controlled. The source housing 4 can be coupled, via a flange coupling 12, to an electrode system housing 14 which is similarly connected to an object housing 18 by way of a flange coupling 16. An electrode system 19 of the present embodiment comprises a system of acceleration, deflection or collimation electrodes 20, an electrode 201 which is situated nearest to the source comprising an anode 22 having an aperture 24 wherethrough a particle beam 25 enters the apparatus. For the deflection of the beam 25 a tilted electrode system 26 is arranged between two successive electrodes 20. The electrode system 26 in this case comprises a tilted disc 28 and a tilted disc 29, which discs are mounted against successive electrodes 202 and 203 of the electrode system 19. Facing surfaces of the tilted discs preferably extend in parallel. Also viewed from a point of conductivity, the tilted discs may be integral with the relevant electrodes 20, in which case they will carry corresponding potentials. Beam deflection is thus realized with only minor modifications to the acceleration system and its control.

The degree of beam deflection is determined by the tilt angle which amounts to, for example from 10° to 15°, and the cross-section of the beam aperture which amounts to, for example, 20 mm. Electrostatic controls are not required in this respect and the potentials of the two modified electrodes 20 need in principle not be changed.

Alternatively, the tilted discs 28 and 29 can also be arranged so as to be insulated from the electrodes 20 and be provided with electrical power supply leads for an electrostatically controllable degree of beam deflection. Using a tilted electrode system, the beam 25 is deflected, for example through an angle 30 and enters an object space 33, via a final electrode 204, at an angle with respect to the optical axis 31 of the apparatus. In order to prevent beam disturbances, the final electrode may alternatively be non-axially arranged or be provided with a larger aperture 34. It is to be noted that the beam deflection angle 30 is comparatively small and amounts to, for example, only a few degrees. The beam shift with respect to the optical axis 31 at the area of the electrode 204 then amounts to at most approximately 1 mm in the case of a small distance of, for example, 10 mm between the electrode 204 and the deflection point 32 of the beam.

For example, the electron beam is directed as a pure electron beam 45 from the deflected beam 25 to an object 46 by means of a magnetic beam alignment system 40 comprising two deflection coils 42 and 44 which act in mutually perpendicular directions. The object 46 is mounted on an object carrier 48 whereby the object can be translated and possibly also rotated and tilted.

Signals generated by the beam 45, for example, secondary electrons, X-rays, reflected electrodes, and transmitted electrons can be measured by means of detectors 50. Via the object carrier, electrons intercepted by the object can also be measured.

Ions present in the beam 25 are not deflected or only slightly deflected by the beam alignment system and can be intercepted, for example, by means of a diaphragm 52.

For the selection of a pure ion beam from a beam which also contains, for example, electrons the same approach can be used in principle; however, preferably the electrons are deflected again for interception by a diaphragm, an object to be irradiated being oriented about a main ray of the electrostatically deflected beam. It may then be advantageous to reverse the position of the electrostatic deflection and the magnetic deflection, viewed in the direction of the beam path.

What is claimed:

1. A beam apparatus of charged particles comprising
   (a) source means for generating a beam of charged particles along a beam axis, said charged particles being both electrons and ions,
   (b) a multiple number of sequentially disposed electrode means for collimating and accelerating said charged particle beam, said sequentially disposed electrode means being disposed along said beam axis,
   (c) means disposed toward an exit of said multiple number of electrode means for spatially separating said electrons and ions in said charged particle beam by deflection from said beam axis,
   said means including an electrostatic deflection device and a magnetic deflection device cooperating therewith to separate said electrons and said ions, said means directing either one of said electrons or said ions to an object to be irradiated,
   wherein said electrostatic deflection device includes at least a pair of tilted electrodes of said multiple number of electrode means, said tilted electrodes being tilted from said beam axis.

2. A beam apparatus according to claim 1, wherein said tilted electrodes are disposed at an angle from 10° to 15° to said beam axis.

3. A beam apparatus according to claim 2, wherein said tilted electrodes are free of electrostatic control, and have a potential of said multiple number of electrode means.

4. A beam apparatus according to claim 2, wherein said tilted electrodes are insulated from said multiple number of electrode means, and are connected to an electrical power supply.

5. A beam apparatus according to claim 2, wherein said beam of charged particles is deflected an angle of only a few degrees from said beam axis.

6. A beam apparatus according to claim 5, wherein said magnetic deflection device includes a beam alignment system substantially compensating for a beam deflection by said electrostatic deflection device.

7. A beam apparatus according to claim 6, wherein said magnetic deflection device is disposed in said multiple number of electrode means adjacent said object to be irradiated.

8. A beam apparatus according to claim 1, wherein said magnetic deflection device includes a beam alignment system substantially compensating for a beam deflection by said electrostatic deflection device.

9. A beam apparatus according to claim 8, wherein said magnetic deflection device is disposed in said multiple number of electrode means adjacent said object to be irradiated.

10. A beam apparatus of charged particles comprising
    (a) source means for generating a beam of charged particles along a beam axis, said charged particles being both electrons and ions,
    (b) a multiple number of sequentially disposed electrode means for collimating and accelerating said charged particle beam, said sequentially disposed electrode means being disposed along said beam axis,
    (c) means disposed toward an exit of said multiple number of electrode means for spatially separating said electrons and ions in said charged particle beam by deflection from said beam axis,
    said means including an electrostatic deflection device and a magnetic deflection device cooperating therewith to separate said electrons and said ions, said means directing either one of said electrons or said ions to an object to be irradiated,
    wherein said magnetic deflection device includes a beam alignment system means disposed after said electrostatic deflection device for substantially compensating for a beam deflection by said electrostatic deflection device.

11. A beam apparatus according to claim 10, wherein said magnetic deflection device is disposed in said multiple number of electrode means adjacent said object to be irradiated.

* * * * *